United States Patent [19]
Noeker

[11] Patent Number: 5,234,571
[45] Date of Patent: Aug. 10, 1993

[54] STEPPED MOLD INSERTS, A PROCESS FOR THE MANUFACTURE OF STEPPED MOLD INSERTS, AND STEPPED MICROSTRUCTURAL BODIES WITH THE MOLD INSERTS

[75] Inventor: Friedolin F. Noeker, Karlsruhe, Fed. Rep. of Germany

[73] Assignee: MicroParts GmbH, Karlsruhe, Fed. Rep. of Germany

[21] Appl. No.: 980,690

[22] Filed: Nov. 24, 1992

[30] Foreign Application Priority Data

Dec. 19, 1921 [DE] Fed. Rep. of Germany ....... 4142001

[51] Int. Cl.⁵ .............................................. C25D 1/10
[52] U.S. Cl. ..................................................... 205/70
[58] Field of Search ......................................... 205/70

[56] References Cited
FOREIGN PATENT DOCUMENTS
289426 5/1991 Fed. Rep. of Germany.

Primary Examiner—T. M. Tufariello
Attorney, Agent, or Firm—Oblon, Spivak, McClelland, Maier & Neustadt

[57] ABSTRACT

A process to manufacture stepped mold inserts and stepped microstructural bodies molded with the mold inserts. Stepped mold inserts are manufactured using structured irradiation masks with regionally different absorption for x-radiation; to this end, extensive calculations are necessary. Furthermore, several masks can be used in succession and for each irradiation step the penetration depth of the x-radiation can be changed. These masks must be positioned with high precision. With the present process stepped mold inserts are manufactured by a simple procedure. Several layers of varying thickness are applied on a metal plate alternating with non-conductive and conductive material. The layered stack is prestructured by precision mechanical machining at depths that vary from region to region, filled with a resist material and irradiated preferably through a single structured mask. Following the "development" of the resist layer, metal is electrodeposited in the microstructure and the metallic mold insert is separated from the resist structure.

10 Claims, 5 Drawing Sheets

STEPPED MOLD INSERTS, A PROCESS FOR THE MANUFACTURE OF STEPPED MOLD INSERTS, AND STEPPED MICROSTRUCTURAL BODIES WITH THE MOLD INSERTS

BACKGROUND OF THE INVENTION

1. Field of the Invention

The invention relates to stepped mold inserts, with which stepped microstructural bodies are manufactured, and a process to manufacture the stepped mold inserts. The present invention also relates to a process for economically manufacturing stepped microstructural bodies.

2. Discussion of the Related Art

Microstructural bodies manufactured according to the LIGA procedure have microstructures with lateral dimensions in the micrometer range at a height that can amount to several hundred micrometers. Generally the microstructural bodies are planar, i.e., the lateral dimensions of the microstructures are virtually constant over the entire height of the structure.

According to EP-184 608, bodies with column-like microstructures can be manufactured whose heights are different in two regions. In addition, one layer of a plastic, whose properties can be altered through x-radiation (resist material), is first partially irradiated through a structured mask, whereby the x-radiation penetrates through the entire thickness of the resist layer. The resist layer is subsequently irradiated again with X-radiation through a second structured mask, whereby the penetration depth of the radiation is less than the thickness of the resist layer and the irradiated regions are larger than during the first irradiation procedure. This process is fundamentally suitable for manufacturing microstructural bodies having more than two different structural heights. Each structural height requires its own irradiation step. For each irradiation step a separate mask is used that is to be positioned with high precision relative to the already irradiated regions of the resist layer. Thus, the expense is significantly increased and the yield is noticeably decreased.

In EP-253 066 a process for the manufacture of microstructural bodies with regions whose structural height varies is specified. A resist layer is irradiated once through a single mask, whose structure corresponds to the structure of the microstructural body (absorber structure) (deep x-ray lithography). The mask comprises a structured layer, which absorbs almost totally the x-radiation (total absorber layer), and at least one other structured layer, which absorbs only partially the x-radiation (partial absorber layer). The resist material is a plastic with a sharp lower limit dose, e.g., polymethyl-methacrylate. For the partial absorber layers, substances with varying absorptibility within the wavelength range of the x-radiation that is applied are used. The kind of partial absorber materials, their respective layer thickness, the spectrum of the x-radiation applied and the radiation dose are to be adjusted to the desired varying structural heights of the microstructural body. This procedure needs extensive calculations.

SUMMARY OF THE INVENTION

Accordingly, an object of the present invention is to manufacture by a simple procedure stepped mold inserts with which stepped microstructural bodies can be subsequently molded utilizing a process which overcomes the above-mentioned drawbacks.

The present invention relates to a process for the manufacture of stepped mold inserts utilized to mold stepped microstructural bodies. The process comprising the steps of applying an electrically non-conductive layer on a base plate made of an electrically conductive material such that the thickness of the non-conductive layer substantially corresponds to the height of the step; applying an electrically conductive layer on the non-conductive layer such that the thickness of the conductive layer is less than the thickness of the non-conductive layer; prestructuring the layers applied on the base plate by precision mechanical machining to remove regions of the layers such that the removed regions reach down to the conductive base plate; filling the removed regions and covering the base plate with a resist material, whose thickness corresponds to the entire height of the microstructural body to be molded; irradiating the recess layer through at least one structured mask; dissolving the regions of the resist material that have remained soluble or have become soluble; electrodepositing a metal in those regions from which the resist material was dissolved out and covering all regions with a layer of metal that is one to several millimeters thick; and removing the base plate and dissolving out the remaining parts of the conductive and non-conductive layers for obtaining the stepped mold.

BRIEF DESCRIPTION OF THE DRAWINGS

A more appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

In the present invention, a process in which a base plate is made of an electrically conductive material, preferably a metal such as copper, steel, aluminum, titanium is disclosed. Even electrically conductive plastics are suitable; they are optionally filled with carbon black or with conductive fibers. One or several electrically non-conductive layers are applied on the base plate. The layers are made of one or optionally several different plastics, resulting in a firmly adhering bond with the base plate or the layer beneath the same. Suitable plastics are epoxy resins, polyester resins, epoxy phenol resins and the like; to build the layers such substances are preferably used whose coefficients of linear expansion are approximately the same; then the result is only moderately large mechanical stresses and virtually no cracks. The electrically non-conductive layers are applied by caste coating, cementing, stamping, grafting, or similar techniques.

The non-conductive layers have a thickness, which for one layer or several layers combined together corresponds to the height of the related step of the microstructural body that is molded later. The thickness of the layer is limited by the stability of the microstructures that are produced and by the structural heights that can be achieved with the LIGA process; the thickness can range up to about 1,000 micrometers, depending on the lateral dimension.

An electrically conductive layer (intermediate layer) is applied on each non-conductive layer by means of deposition, cementing or sputtering or—for conductive plastics—by cast coating. These layers are made of metal such as gold, silver, titanium, copper, nickel, or conductive plastic. The thickness of these conductive (intermediate) layers is generally only a few micrometers; it is usually negligibly thick compared to the thickness of the non-conductive layers, on the other hand, their thickness is considered for the thickness of the non-conductive layer beneath the same. The conductive layers form the electroplated starting layers (electrodes) during the later electrodeposition of metal and, to this end, make electric contact or make contact with themselves during the deposition process of the metal.

The layers applied on the base plate are prestructured by precision mechanical procedures. This includes drilling, milling, laser machining, diamond cutting procedures and other precision removal procedures. The bottom of each removed region is preferably totally—formed by one of the electrically conductive layers or by the conductive base plate. The removed regions go optionally through several non-conductive and conductive layers.

The precision machining has a depth accuracy in the micrometer range. Thus, a small amount of the surface of a conductive intermediate layer that is several micrometers thick may be removed. The relatively thick base plate or an adequately thick intermediate layer can be drilled or milled even relatively deep. Reaching conductive layer can be automatically and accurately monitored, e.g. by closing an electric circuit between the conductive layer and the conductive removal tool. During the removal procedure with low depth accuracy the conductive layer must be designed correspondingly thick.

For later electrodeposition of metal, it is sufficient according to experience, if the bottom of each removed region has at least one electrically conductive and externally contactable "point", where electrodeposition begins; the edges and corners on the bottom of a removed region do not have to be totally free of non-conductive material.

Following the precision mechanical machining, the removed regions are filled with a resist material; the plate is covered with the same resist material, whose thickness corresponds to the total height of the microstructural body that is molded at a later date. The surface of the resist layer is optionally removed through precision mechanical machining down to the desired depth.

Suitable resist materials are either a positive resist such as polymethyl-methacrylate (PMMA) (e.g., Plexit 60 of the Röhm Company) or a negative resist (e.g., Ray-PN (AZ-PN) of the Hoechst Company).

The entire thickness of the resist layer is irradiated, e.g. with x-radiation, through structured masks, preferably through a single structured mask. A suitable x-radiation is preferably the synchrotron radiation from an electronic synchrotron with e.g. 2.3 GeV electron energy.

Owing to the irradiation the positive resist is soluble in the irradiated regions and remains insoluble in the non-irradiated regions; the negative resist remains soluble in the non-irradiated regions and is insoluble in the irradiated regions. The "solubility" of the resist refers always to the action of a specific solvent ("developer") with the chosen dissolving conditions.

The surfaces produced with precision mechanical machining lie in the layers applied on the base plate—at least for the surfaces (side walls) extending parallel to the direction of irradiation-in the case of a positive resist preferably completely in the non-irradiated regions, in the case of the negative resist preferably completely in the irradiated regions; they are covered by the regions of the resist layer that have become insoluble or have remained insoluble. A certain roughness of these mechanically produced surfaces is acceptable or desired. However, the side walls produced with precision mechanical machining can lie in part also outside the non-irradiated regions of a positive resist or outside the irradiated regions of a negative resist.

Following irradiation, the regions of the resist layer that have become soluble or remained soluble are dissolved with a solvent ("developer") and removed. For PMMA the GG developer, for example, according to DE-OS 30 39 110 is suitable; for the negative resist AZ-PN, an aqueous ammonium hydroxide solution is suitable as the developer.

Finally a metal is electrodeposited in the regions from which the resist layer is dissolved out. To this end, nickel, copper, gold, alloys of nickel and cobalt or nickel and iron and the like ar suitable. After the structure has been completely filled with metal, another metal is electrodeposited forming a cohesive layer several millimeters thick, in order to hold together the mold insert and stabilize it for the subsequent molding of the microstructural bodies; thus, additional metal is deposited on the structure filled with metal. With respect to the thickness of the deposited layer a compromise must be made between the mechanical stability of the mold insert and the time required for the electrodeposition of metal.

During the electrodeposition of metal it is generally sufficient to apply the electric contact only to the conductive base plate. The conductive layers above the same make contact by themselves, as soon as the metal layer started on the base plate has reached the corresponding thickness. If the conductive (intermediate) layers are contacted separately, the place and time of the electrodeposition must be specified. This can be utilized, e.g. if, before the nickel is deposited for the mold insert, sacrificial layers of gold, copper or other metals are to be additionally deposited. Such sacrificial layers serve to prevent burs (underplating).

If desired, the surface of the electrodeposited, cohesive metal layer can be machined mechanically flat.

The base plate is removed, preferably mechanically, by a metal cutting operation such as milling or sawing. Optionally the base plate can also be torn off. An optimal removal procedure requiring no machining forces is, e.g. spark erosion or etching. Even a combination of different removal operations is suitable.

Optionally the regions of the electroplated metal that at this stage is exposed on a level with the surface of the base plate are mechanically reworked.

Finally the parts of the non-conductive and the conductive layers that remained in the electrodeposited metal body are removed. To this end, following removal of the base plate, an adhesive can be poured over the exposed layer; following hardening, the adhesive can be pulled off and thus takes with it the adhering parts of the layers to be removed from the metal structure. On the other hand, the remaining parts of the resist layer can be dissolved out, optionally following flood irradiation, and subsequently an adhesive is poured over the plate; the adhesive is then pulled off and thereby takes with it the adhering parts of the layers to be removed from the metal structure. Furthermore, the layers to be removed can be selectively dissolved out, to which and solvents are used that are significantly more aggressive than the previously used "developer"; in addition, the solution temperature can be raised.

Non-conductive layers, hidden under an insoluble or slightly soluble layer, can be exposed optionally by undercutting the conductive (metal) layer.

After all substances have been removed from the electrodeposited metal structure, the finished metallic mold insert is exposed.

Stepped microstructural bodies made of plastic are molded with the aid of the stepped mold insert. To mold, plastics such a polymethyl-methacrylate, polyoxymethylene, polycarbonate, polyamide, heat resistant and/or chemical resistant plastics such as polyvinylidene-fluoride (PVDF) or polyether ether ketone (PEEK) and powdery sintered materials are suitable, the latter being rendered plastically moldable with or without the addition of a binder. The microstructures, being produced thus, being made of plastic or sintered material and being complementary to the microstructure of the stepped mold insert, can be removed by the conventional procedure from the mold insert, thus obtaining the stepped microstructural body. The stepped mold insert can be used to mold repeatedly such microstructural bodies.

Metal microstructures which are complementary to the structure of the mold insert can be molded from metal mold inserts having a suitable microstructure, e.g. with conical walls or small aspect ratio. To this end, a relatively precious metal (such as gold or platinum) is electrodeposited in a mold insert, e.g. made of a relatively non-precious metal (such as copper or nickel).

Either the relatively precious metal can be deposited only up to the height of the previously existing surface of the base plate, or other relatively precious metal can be deposited forming an adequately thick layer on the microstructure. In both cases the original metallic mold insert, e.g. made of nickel, is chemically or electrochemically dissolved out and thus sacrificed. Thus, for this procedure the original mold insert can be used only once.

In the first case a stepped microstructural body made of the relatively precious metal (e.g. gold) is obtained. In the second case a stepped mold insert, whose microstructure is complementary to the microstructure of the original mold insert is obtained; it can now be used to repeatedly mold stepped microstructural bodies made of plastic or sintered material.

The process of the invention, the stepped mold inserts manufactured by the process, and the molded stepped microstructural bodies have the following advantages:

The stepped mold insert is quite true to measure, because it is built on a solid base plate during all of the process steps.

The process to manufacture the stepped mold insert is less susceptible to errors; and the percentage of rejected finished mold inserts is low.

To manufacture the mold insert only one single irradiation mask is preferably needed, thus keeping the expense within limits.

To manufacture the mold insert, only one single irradiation is preferably necessary. The resist layer is structured preferably in one single step; no offset between several structuring steps can occur.

The surfaces of the structured resist layer that are present for the subsequent molding operation are totally or predominantly generated by lithography and have, as well known, an extremely low peak to valley height. The walls produced by precision mechanical machining may or should be relatively rough.

The stepped mold insert is manufactured without interruption by electrodeposition of metal.

The electrically conductive (intermediate) layers are flat, even when the multistepped mold insert has different structural heights.

To structure the layered stack on the base plate, electronically controlled, programmable, fully automatic machines are used with high repeatability and high trueness to measure.

If only one non-conductive layer, covered with a relatively thin conductive layer, is applied on the base plate, stepped structured mold inserts are obtained with which one-piece, two stepped microstructural bodies can be molded. If several non-conductive layers, between which there is a relatively thin conductive layer, are applied in succession on the base plate, stepped structured mold inserts can be produced with which one-piece, multistepped microstructural bodies can be molded. An electrically conductive (intermediate) layer is provided for each structural height of the stepped microstructural body.

Figure 1A:
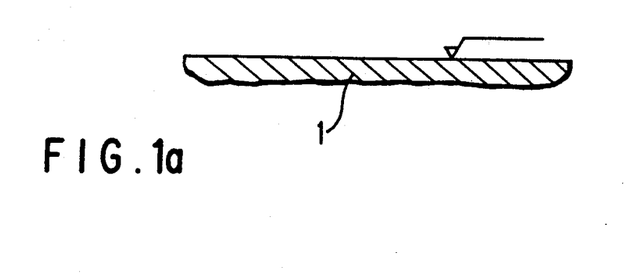
FIGS. 1a-1h illustrate the manufacture of a two stepped mold insert using a positive resist.
Figure 1B:
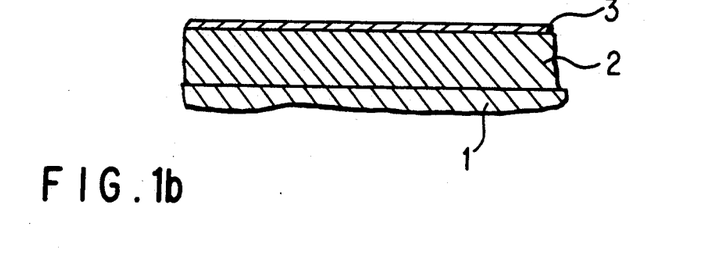
Figure 1C:
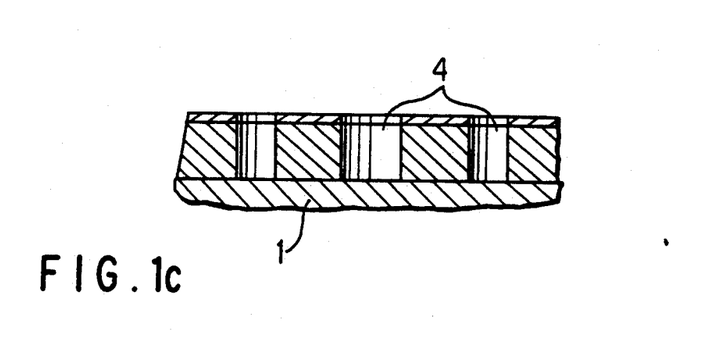
Figure 1D:
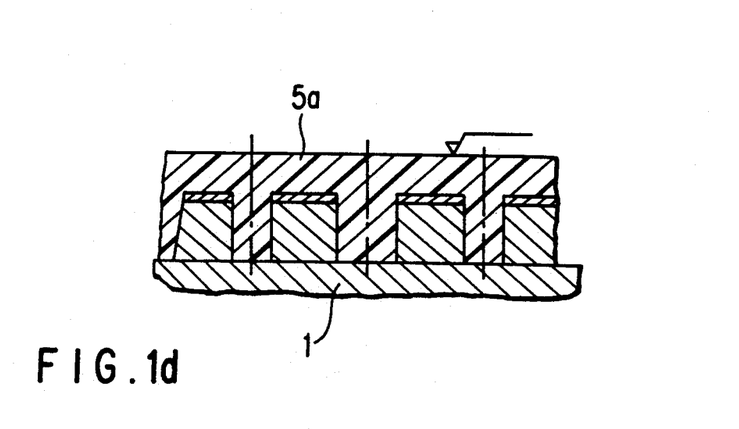
Figure 1E:
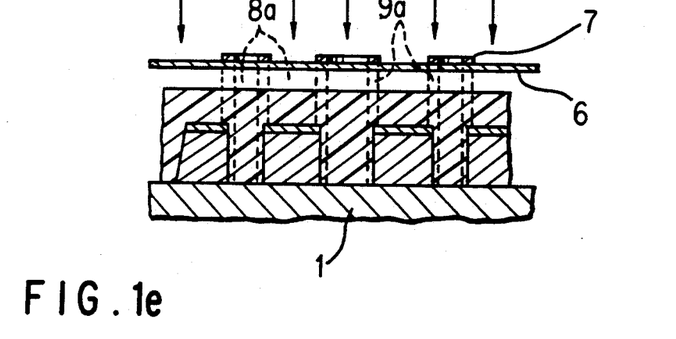
Figure 1F:
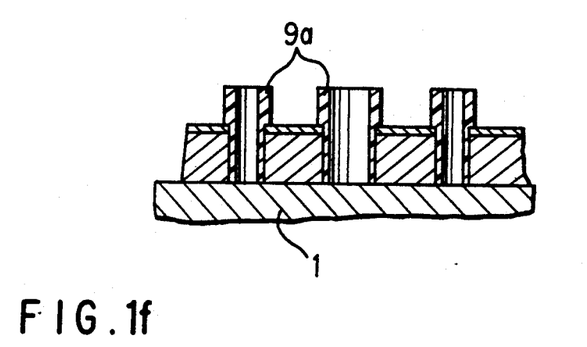
Figure 1G:
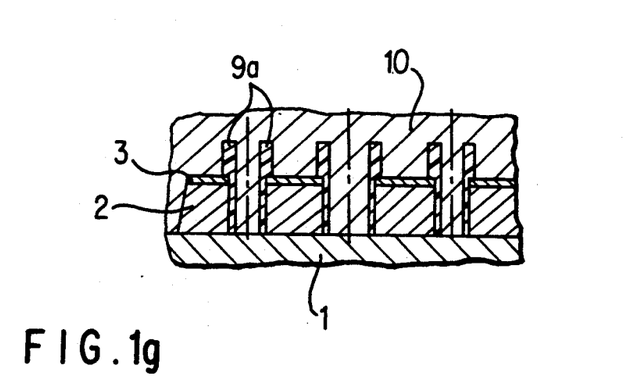
Figure 1H:
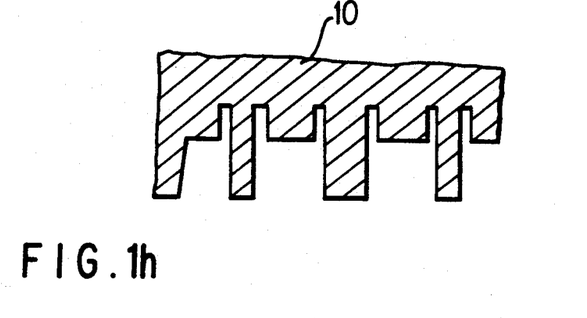

Referring now to the drawings, wherein like reference numerals designate identical or corresponding parts throughout the several views, FIGS. 1a to 1h show the manufacture of a two stepped mold insert using a positive resist. An electrically non-conductive layer (2) and an electrically conductive layer (3) are applied on the base plate (1) having a planar surface or a surface that is machined flat. Both layers are removed by precision mechanical machining in the regions (4) down to the surface of the base plate. The removed regions are filled with a positive resist (5a); and another resist material is applied. The surface of the cohesive resist layer can be machined flat mechanically, if desired. The resist layer is irradiated through a mask, the radiation penetrating the entire thickness of the resist layer. A mask carrier (6) is provided with an absorber structure (7) whose structure corresponds to the structure, which was produced by precision mechanical machining of the layers (2) and (3). FIG. 1e shows the exposed regions (8a), which have become soluble; and the unexposed regions (9a), which have remained insoluble. FIG. 1f is a cross sectional view of the structure remaining after the regions (after the "developer") that have become soluble have been dissolved. In this structure when a conductive layer metal (10) is electrodeposited on the bottom of each region; the filled structure is covered with an adequately thick layer of the same metal, FIG. 1g. After removal of the base plate (1) and dissolution of the still existing parts of the electrically non-conductive layer (2), the conductive layer (3) and the unexposed parts (9a) of the resist layer, the two stepped mold insert (10) made of metal is produced, FIG. 1h.

Figure 2A:
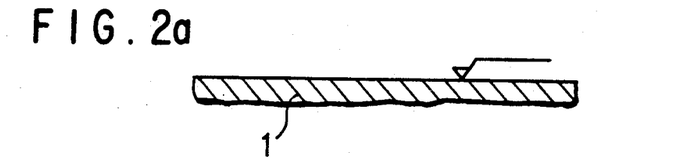
FIGS. 2a-2h illustrate the manufacture of a four stepped mold insert using a negative resist.
Figure 2B:
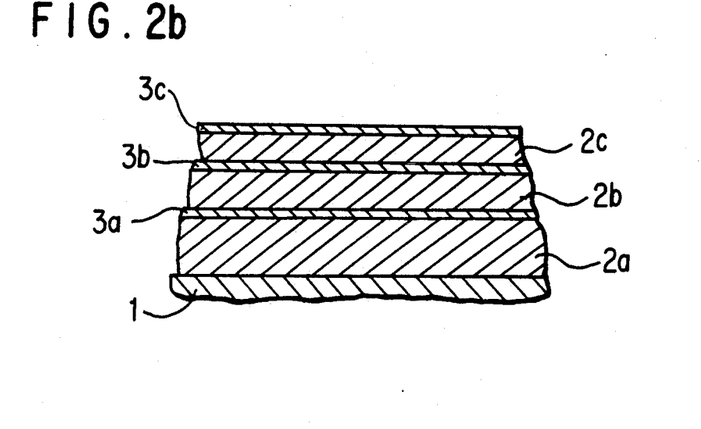
Figure 2C:
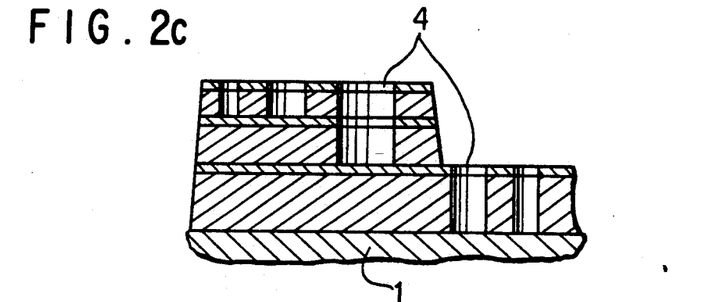
Figure 2D:
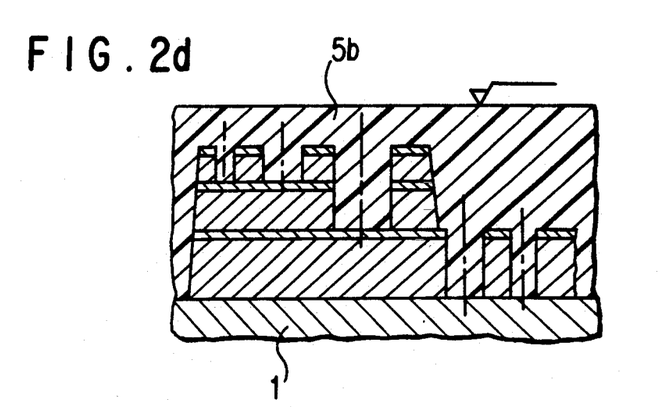
Figure 2E:
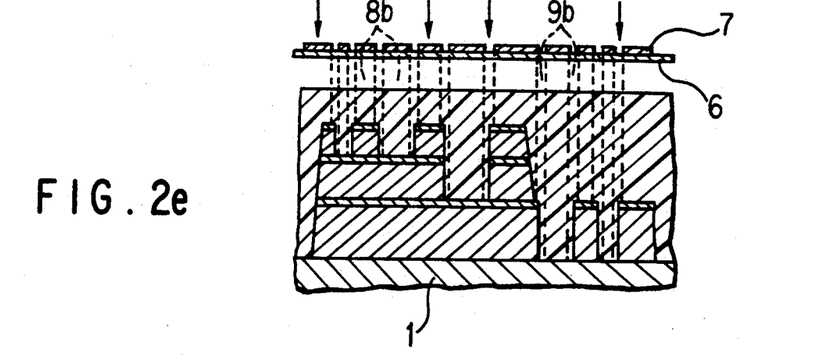
Figure 2F:
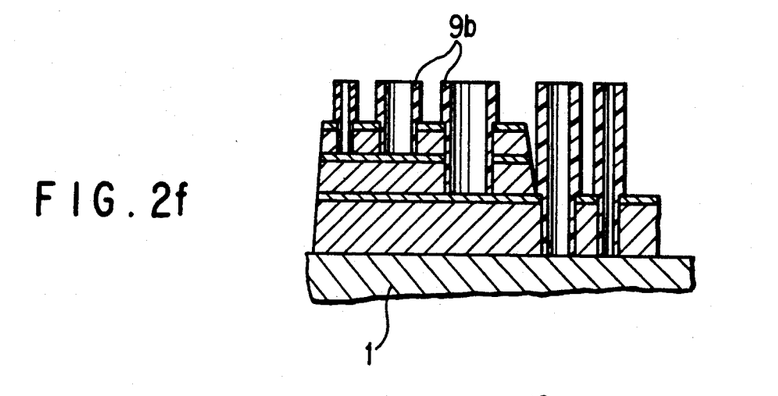
Figure 2G:
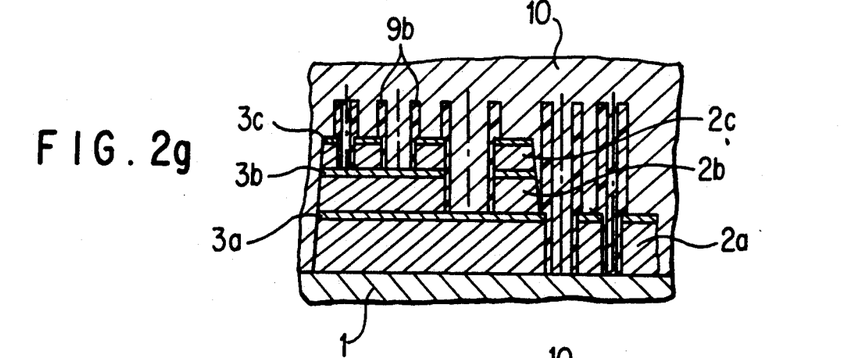
Figure 2H:
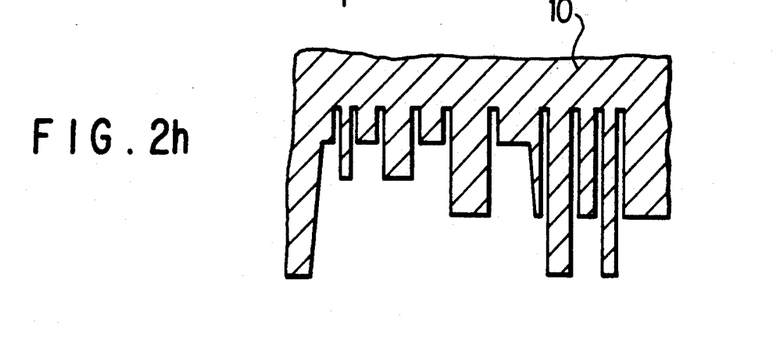

FIGS. 2a to 2h show the manufacture of a four stepped mold insert using a negative resist. First an electrically non-conductive layer (2a), covered with a conductive layer (3a), is applied on the base plate (1) having a flat surface or a surface that is machined flat. The corresponding layers (2b), (3b), (2c) and (3c) are then applied, thus resulting in the layered stack. This six layered plate is removed in the regions (4) by precision mechanical machining and prestructured; the bottom of each removed region is formed by a conductive layer or the conductive base plate. The removed regions can penetrate one, several, or all non-conductive layers. The removed regions are filled with a negative resist (5b); and another resist material is applied. The surface of the cohesive resist layer can be machined flat mechanically, as desired. The resist layer is irradiated through a mask with the radiation penetrating the entire thickness of the resist layer. A mask carrier (6) is provided with an absorber structure (7), whose structure corresponds to the structure, which was produced by precision mechanical machining of the layers (2a) to (3c). FIG. 2e shows the exposed regions (9b), which have become insoluble, and the unexposed regions (8b), which have remained soluble. FIG. 2f shows the structure remaining after the regions that have remained soluble have been dissolved. In this structure when a conductive layer metal (10) is electrodeposited on the bottom of each region; the filled structure is covered with an adequately thick layer of the same metal, FIG. 1g. After removal of the base plate (1) and dissolution of the still existing parts of the electrically non-conductive layers (2a) to (2c), the conductive layers (3a) to (3c) and the exposed parts (9b) of the resist layer, the four stepped mold insert (10) made of metal is produced, FIG. 2h.

Figure 3:
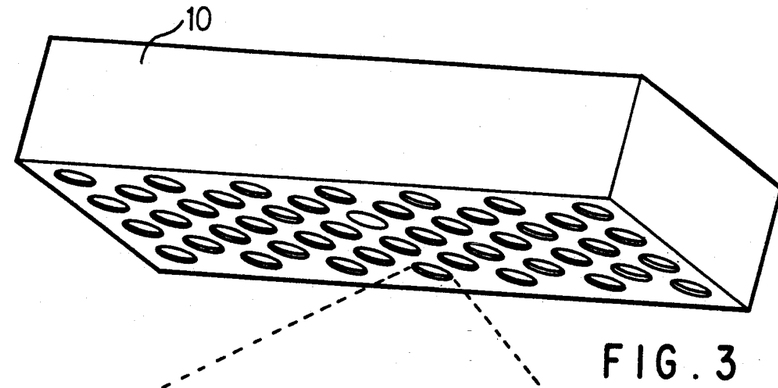
FIGS. 3 and 4 illustrate as examples the practical design of a two-step mold insert.
Figures 4, 5:
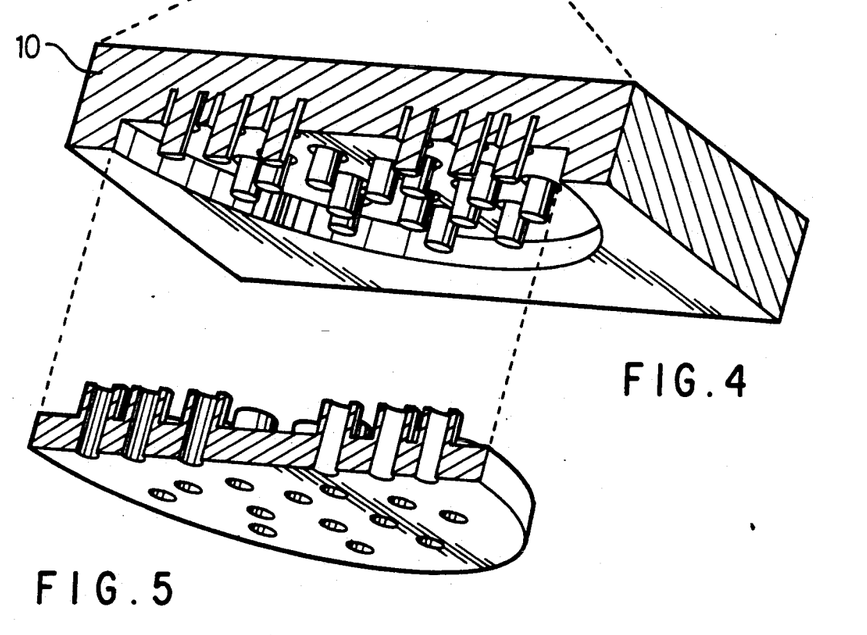
FIG. 5 is an oblique view and cross sectional view of one of the, for example, 46 microstructural bodies simultaneously molded from the mold insert according to FIG. 3.

FIGS. 3 and 4 show as examples the practical design of a two step mold insert. FIG. 3 shows the mold insert produced by electrodeposition of metal. The metal plate is e.g. 10 mm thick, about 70 mm long and about 30 mm wide. It is provided for simultaneous molding of 46 microstructural bodies. FIG. 4 is a cross sectional view and an exploded drawing of the details of a sub-area of the mold insert. The fragment in FIG. 4 corresponds to FIG. 2h.

Figure 6:
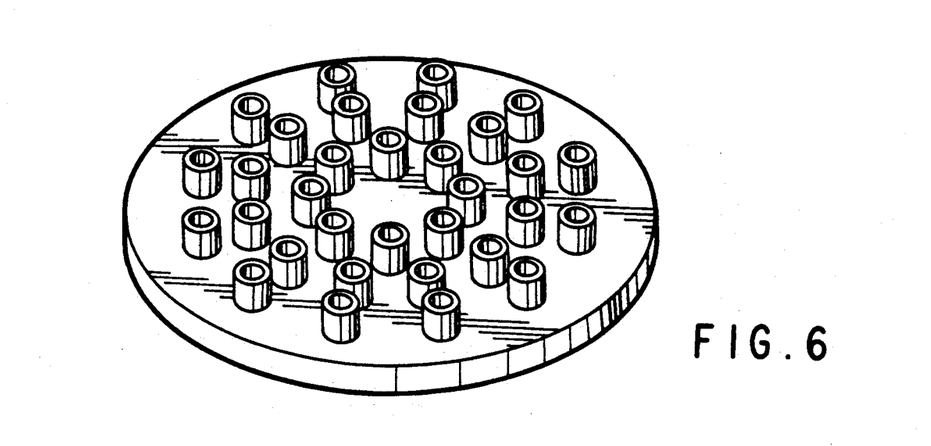
FIG. 6 is an oblique view of the two stepped microstructural body.

FIG. 5 is an oblique view and cross sectional view of one of the 46, for example, microstructural bodies molded simultaneously from the mold insert according to FIG. 3. FIG. 6 is an oblique view of the two stepped microstructural body. The essential dimensions of this microstructural body are for example;
diameter of the plate: 4 mm
height of the body and length of the channels: 0.5 mm
number of channels: 32
diameter of a channel: 0.2 mm
thickness of the channel wall in the projecting part: 0.05 mm The microstructural body according to FIG. 6 can be used as a microvalve. With a low throughput it is necessary or expedient to keep the dimensions of the valve suitably small. The lift to operate a microvalve is correspondingly short; it defines the size of the lift drive and the switching time of the microvalve. Such a microvalve plate is a multiseat valve comprising many one seat valves connected in parallel and opening and closing simultaneously by way of a single valve disk. The valve seats are arranged so as to economize on space. In the two stepped plate the valve seats are raised; thus the pressure loss of the medium flowing out of the valves disposed internally is significantly reduced. The flow conditions in the vicinity of the valve can be optimized by the distances between the valve seats. Many individual valve seats with small seat surfaces result in a better seal of the valve, because with the given closing force the mechanical pressure at the seats is high.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the U.S. is:

1. A process for the manufacture of stepped mold inserts utilized to mold stepped microstructural bodies, comprising the steps of:
　applying an electrically non-conductive layer on a base plate made of an electrically conductive material such that the thickness of the non-conductive layer substantially corresponds to the height of the step;
　applying an electrically conductive layer on the non-conductive layer such that the thickness of the conductive layer is less than the thickness of the non-conductive layer;
　prestructuring the layers applied on the base plate by precision mechanical machining to remove regions of the layers such that the removed regions reach down to the conductive base plate;
　filling the removed regions and covering the base plate with a resist material, whose thickness corresponds to the entire height of the microstructural body to be molded;
　irradiating the resist layer through at least one structured mask;
　dissolving regions of the resist material that have remained soluble or have become soluble;
　electrodepositing a metal in those regions from which the resist material was dissolved out and covering all regions with a layer of metal that is one to several millimeters thick; and
　removing the base plate and dissolving out the remaining parts of the conductive and non-conductive layers for obtaining the stepped mold insert.

2. The process as claimed in claim 1, wherein said step of applying an electrically non-conductive layer on the base plate comprises the steps of:
　repeatedly applying an electrically non-conductive layer whereby the thickness of each non-conductive layer alone or together with one or more non-conductive layers above the same corresponds to the height of one step, alternating with the application of one thin electrically conductive layer; and
　the prestructuring step comprises the step of:
　prestructuring the applied layers by precision mechanical machining to remove regions of the layers, whereby each removed region ends on a conductive layer and optionally penetrates several non-conductive and conductive layers.

3. The process as claimed in claim 1, wherein the filling step comprises the step of:
　filling the removed regions and covering the plate with a positive resist whose thickness corresponds to the total thickness of the microstructural body to be molded; and the irradiating step comprises the step of:

irradiating the resist layer through at least one structured mask, whereby mechanically machined walls of the applied layers produced by the machining lie preferably in the regions shaded by the mask.

4. The process, as claimed in claim 3, wherein:

the side walls produced by precision mechanical machining lie partially within the regions of the positive resist that are shaded by the structured mask.

5. The process as claimed in claim 2, wherein the filling step comprises the step of:

filling the removed regions and covering the plate with a negative resist whose thickness corresponds to the total thickness of the microstructural body to be molded; and the irradiating step comprises the step of:

irradiating the resist layer through at least one structured mask, whereby mechanically machined walls produced by the machining of the applied layers lie preferably in the regions not shaded by the mask.

6. The process as claimed in claim 5, wherein:

the side walls produced by precision mechanical machining lie partially within the regions of the negative resist that are not shaded by the structured mask.

7. A stepped mold insert, manufactured according to the process of one of claims 4 or 6.

8. A stepped microstructural body, manufactured by molding a stepped mold insert, as claimed in claim 7, wherein:

microstructures with at least two steps in a one-piece body are molded differently and exhibit different or identical heights; and the microstructures comprise changing lateral dimensions, based on the total height of the microstructural body.

9. A stepped microstructural body made of plastic, ceramic, or sintered material, manufactured by mechanical shaping of a stepped mold insert, as claimed in claim 7, wherein:

the microstructural body is removed from the mold insert; and the mold insert is used repeatedly for molding.

10. A stepped microstructural body made of metal, manufactured by galvanic molding of a stepped mold insert, as claimed in claim 7, wherein:

the mold insert is dissolved out following molding and the metallic microstructural body is obtained.

* * * * *

UNITED STATES PATENT AND TRADEMARK OFFICE
CERTIFICATE OF CORRECTION

PATENT NO. : 5,234,571
DATED : August 10, 1993
INVENTOR(S) : Friedolin F. Noeker It is certified that error appears in the above-indentified patent and that said Letters Patent is hereby corrected as shown below:

On the title page, Item [30],

The Foreign Application Priority date, should read: --Dec. 19, 1991--

Signed and Sealed this

Fifth Day of July, 1994

*Attest:*

BRUCE LEHMAN

*Attesting Officer*     *Commissioner of Patents and Trademarks*